United States Patent [19]

Aoki

[11] Patent Number: 5,539,689
[45] Date of Patent: Jul. 23, 1996

[54] NONVOLATILE SEMICONDUCTOR STORAGE DEVICE AND SEMICONDUCTOR DEVICE

[75] Inventor: Akihide Aoki, Itami, Japan

[73] Assignees: Mitsubishi Denki Kabushiki Kaisha, Tokyo; Mitsubishi Electric Semiconductor Software Co., Ltd., Hyogo, both of Japan

[21] Appl. No.: 462,725

[22] Filed: Jun. 5, 1995

[30] Foreign Application Priority Data

Oct. 18, 1994 [JP] Japan ................................. 6-252093

[51] Int. Cl.$^6$ ............................................ G11C 7/00
[52] U.S. Cl. .................... 365/185.21; 365/201; 365/208; 365/185.09
[58] Field of Search ..................... 365/185.20, 185.21, 365/185.09, 207, 208, 189.07, 201

[56] References Cited

U.S. PATENT DOCUMENTS

| | | | |
|---|---|---|---|
| 4,799,195 | 1/1989 | Iwahashi | 365/185.21 |
| 4,811,294 | 3/1989 | Kobayashi | 365/189.07 |
| 5,293,333 | 3/1994 | Hashimoto | 365/189.07 |
| 5,305,273 | 4/1994 | Jinbo | 365/185.21 |

FOREIGN PATENT DOCUMENTS

| | | |
|---|---|---|
| 62-229597 | 10/1987 | Japan . |
| 64-88998 | 4/1989 | Japan . |
| 1-300499 | 12/1989 | Japan . |

Primary Examiner—David C. Nelms
Assistant Examiner—Son Mai
Attorney, Agent, or Firm—Lowe, Price, LeBlanc & Becker

[57] ABSTRACT

A nonvolatile semiconductor storage device has a sense characteristic modifying circuit for modifying the sense characteristic of a sense amplifier that amplifies the data in a memory cell and a volatilization discriminating unit that discriminates whether or not a memory cell suffers volatilization by comparing the level of a data read before modifying the sense characteristic and the level of a data read after modifying the sense characteristic. In this nonvolatile semiconductor storage device, the level of the data read on the basis of a sense characteristic with a more strict criterion is compared with the level of the data read on the basis of another sense characteristic with a less strict criterion, and it is discriminated whether or not the memory cell suffers volatilization on the basis of the result of the comparison.

15 Claims, 18 Drawing Sheets

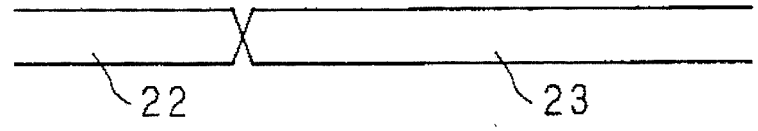
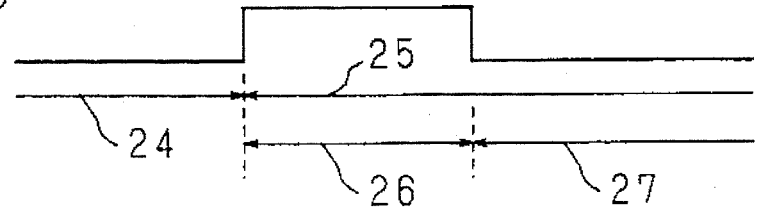

NONVOLATILE SEMICONDUCTOR STORAGE DEVICE AND SEMICONDUCTOR DEVICE

BACKGROUND OF THE INVENTION

1. Field of the Invention

The present invention relates to a nonvolatile semiconductor storage device that can discriminate volatilization of a memory cell, and also to a semiconductor device which the nonvolatile semiconductor storage device is built in.

2. Description of Related Art

In a nonvolatile semiconductor storage device in which a data can be electrically written, it is necessary to maintain the charge in a memory cell so as to hold the written data therein. Owing to a characteristic defect caused in the production procedure for a nonvolatile semiconductor storage device, however, the data written in a memory cell can be volatilized if the charge of the memory cell cannot be maintained for a time sufficient for the usage. As a result, the written data is varied to cause the malfunction of a program to be executed.

Such a characteristic defect can be avoided by a sufficient accelerated test performed after data writing in a memory cell. In order to shorten the development period for a program and to simplify program modification, however, a data is written not at a semiconductor manufacturer where an accelerated test can be performed but at a program development division where an accelerated test device is not available.

A technique for preventing the malfunction caused by such a characteristic defect in a memory cell is disclosed in, for example, Japanese Patent Application Laid-Open Nos. 64-88998 (1989), 1-300499 (1989) and 62-229597 (1987). In this technique, the characteristic of a sense amplifier is varied so as to make the verification criterion for a data written in a memory cell more strict by increasing one of the input potentials to the sense amplifier when performing the verification of the written data.

The sense amplifier in the aforementioned conventional nonvolatile semiconductor storage device has a sense characteristic as is shown in FIG. 1. In the graph of FIG. 1, the abscissa indicates a power voltage and the ordinate indicates a threshold voltage $V_{th}$ of a memory cell after writing a data therein, where the sense characteristic is indicated as a straight line SL going up in the right. In the sense characteristic indicated with the straight line SL, therefore, when the power voltage is $V_0$, the threshold voltage $V_{th}$ of the memory cell after data writing is $V_{th2}$, and the data in the memory cell can be accurately read. In the case where the threshold voltage $V_{th}$ is decreased to be a voltage $V_{th1}$ due to volatilization of the memory cell, the data cannot be read from the memory cell, thereby causing misread.

Further, the nonvolatile semiconductor storage devices disclosed in the aforementioned Japanese Patent Application Laid-Open Nos. 64-88998 (1989), 1-300499 (1989) and 62-29597 (1987) do not perform pseudo read of the data in a memory cell before reading the data from the memory cell. Therefore, the volatilization of the memory cell cannot be discriminated during the usage of the storage.

SUMMARY OF THE INVENTION

The main object of the invention is to provide a nonvolatile semiconductor storage device which performs pseudo read before reading a data from a memory cell so as to discriminate volatilization of a memory cell, and providing a semiconductor device in which the nonvolatile semiconductor storage device is built.

Another object of the invention is to provide a nonvolatile semiconductor storage device which discriminates the volatilization of a memory cell so as to surely prevent the malfunction and the runaway of a device and the like from occurring due to the data read from the volatilized memory cell.

Still another object of the invention is to provide a semiconductor device which can discriminate volatilization of a memory cell and can continuously execute a currently executed program even when the memory cell suffers volatilization.

Still another object of the invention is to provide a semiconductor device which can discriminate volatilization of a memory cell and can re-write the data into the memory cell so as to output the normal data to the external.

The nonvolatile semiconductor storage device of this invention comprises a characteristic modifying unit for modifying the sense characteristic of a sense amplifier for amplifying the data in a memory cell, and a volatilization discriminating unit for discriminating whether or not the memory cell suffers volatilization by comparing the level of the data read before modifying the sense characteristic and the level of the data read after modifying the sense characteristic. The level of the data read on the basis of a sense characteristic with a more strict criterion is compared with the level of the data read on the basis of another sense characteristic with a less strict criterion, and it is determined whether or not the memory cell suffers volatilization, on the basis of the result of the comparison. In this manner, the volatilization of a memory cell can be discriminated, thereby preventing misreading of the data in the memory cell beforehand.

Further, the result of the discrimination is outputted from a volatilization detecting element, and stored in a register. A reset signal is outputted in accordance with the discrimination result. The address of the memory cell suffering volatilization is also detected. The data in one address is read twice during a period excluding a period for reading a data from a memory cell. In a volatilization discriminating mode, the signal inverting period of an enable signal for enabling a data in a memory cell to be read is elongated. Also in accordance with the discrimination result, a drive mode signal for driving a control unit is outputted.

The semiconductor device of this invention has the aforementioned nonvolatile semiconductor storage device and a memory unit for storing the data read before and after modifying the sense characteristic. The level of the data read on the basis of the sense characteristic with the more strict criterion is compared with the level of the data read on the basis of the sense characteristic with the less strict criterion, and it is discriminated whether or not a memory cell suffers volatilization according to the comparison result. The normal data read on the basis of the sense characteristic with the less strict criterion is latched in a data latch circuit. When it is detected that the memory cell suffers volatilization, a control unit is driven by using the latched data in the data latch circuit. Accordingly, misread of the data due to the volatilization of a memory cell can be prevented, and the malfunction of the control unit is also prevented.

Alternatively, the semiconductor device of this invention has the aforementioned nonvolatile semiconductor storage device and a memory unit for storing a data in a memory cell suffering volatilization. The level of the data read on the basis of the sense characteristic with the more strict criterion is compared with the level of the data read on the basis of the other sense characteristic with the less strict criterion, thereby discriminating whether or not the memory cell suffers volatilization. The data in the memory cell suffers the volatilization is stored in the memory unit. When the volatilization is detected, the data in the memory unit is read to execute a program. Accordingly, a currently executed program can be continuously executed even when a memory cell suffers volatilization.

Alternatively, the semiconductor device of this invention has the aforementioned nonvolatile semiconductor storage device, a data latch circuit for latching a data to be written into a memory cell, and an address latch circuit for latching the address of a memory cell suffering volatilization. The normal data read on the basis of the sense characteristic with the less strict criterion is latched in the data latch circuit. The address of the memory cell suffering volatilization is latched in the address latch circuit. In the case where the volatilization is detected, when the address latched in the address latch circuit coincides with an externally input address, the data in the data latch circuit is re-written into the memory cell or a redundancy memory, or is outputted to the external. Accordingly, a currently executed program can be continuously executed even when a memory cell suffers volatilization.

The above and further objects and features of the invention will more fully be apparent from the following detailed description with accompanying drawings.

BRIEF DESCRIPTION OF THE DRAWINGS

FIG. 9 is a timing chart of each signal used in the fifth embodiment;

DESCRIPTION OF THE PREFERRED EMBODIMENTS

The present invention will now be described referring to the accompanying drawings illustrating the embodiments thereof.

(First embodiment of nonvolatile semiconductor storage device)

Figure 1:
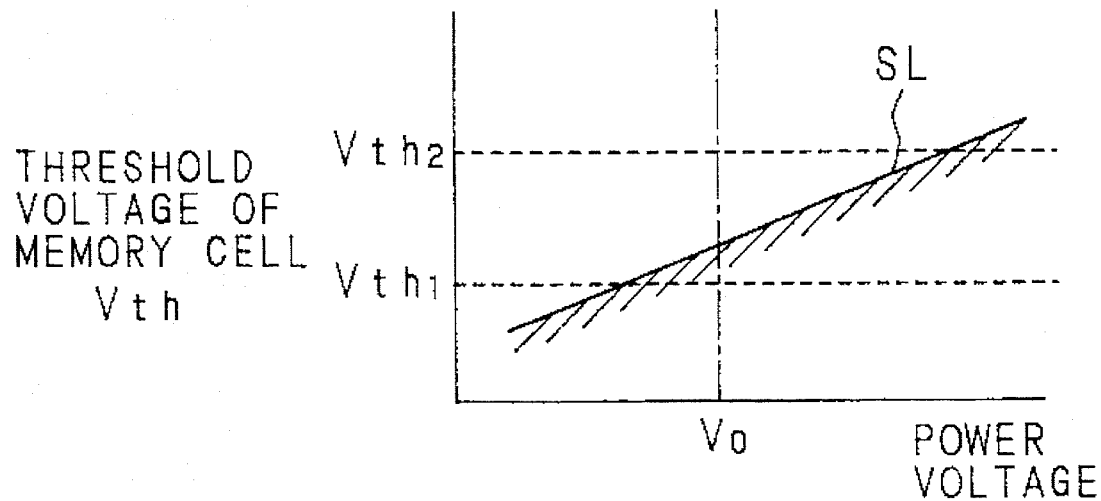
FIG. 1 is a graph showing the sense characteristic of a sense amplifier in a conventional nonvolatile semiconductor storage device.
Figure 2:
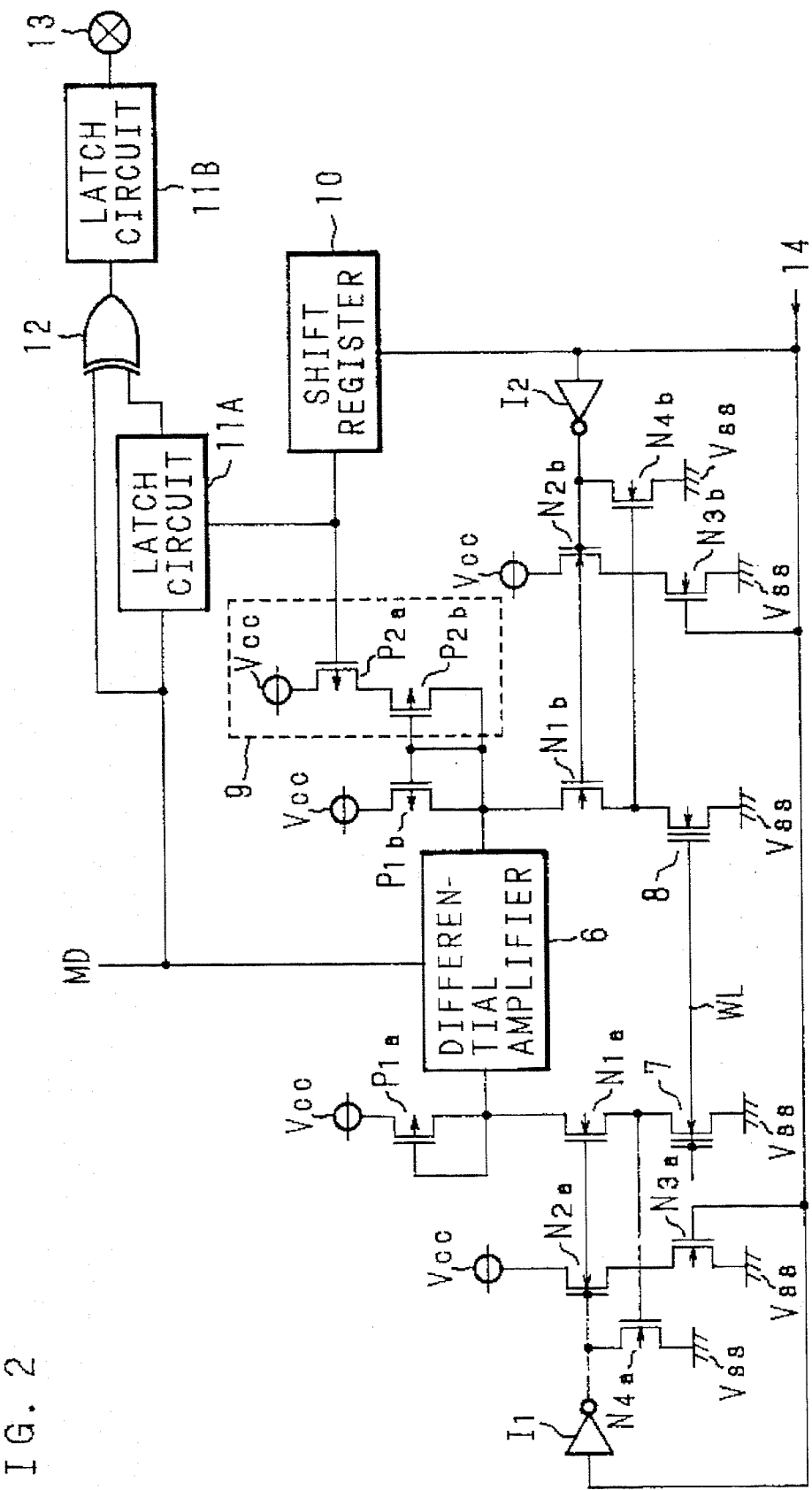
FIG. 2 is a diagram showing the configuration of the main portion of a first embodiment of a nonvolatile semiconductor storage device according to the invention.

FIG. 2 is a block diagram showing the configuration of the main portion of a first embodiment of a nonvolatile semiconductor storage device according to the invention. Disposed between a power voltage terminal $V_{CC}$ and a ground voltage terminal $V_{SS}$ is a series circuit formed with a P-channel transistor $P_{1a}$ ($P_{1b}$), an N-channel transistor $N_{1a}$ ($N_{1b}$) and a memory cell 7 (8). The memory cell 8 is used not for data write but for data reference. The control gates of the memory cells 7 and 8 are commonly connected to a word line WL. A node between the P-channel transistor $P_{1a}$ ($P_{1b}$) and the N-channel transistor $N_{1a}$ ($N_{1b}$) is connected to the gate of the P-channel transistor $P_{1a}$ ($P_{1b}$) and one input terminal (another input terminal) of a differential amplifier 6.

Further, disposed between another power voltage terminal $V_{CC}$ and another ground voltage terminal $V_{SS}$ is a series circuit formed with an N-channel transistor $N_{2a}$ ($N_{2b}$) and an N-channel transistor $N_{3a}$ ($N_{3b}$). The gates of the N-channel transistors $N_{2a}$ and $N_{3a}$ ($N_{2b}$ and $N_{3b}$) are connected to each other, and the gate of the N-channel transistor $N_{2a}$ ($N_{2b}$) is grounded via an N-channel transistor $N_{4a}$ ($N_{4b}$). The gate of the N-channel transistor $N_{4a}$ ($N_{4b}$) is connected to a node between the N-channel transistor $N_{1a}$ ($N_{1b}$) and the memory cell 7 (8).

A read signal 14 is supplied to an inverter $I_1$, the gates of the N-channel transistors $N_{3a}$ and $N_{3b}$, an inverter $I_2$ and a shift register 10. The shift register 10 outputs a data for alternately switching between pseudo read and ordinary read. The output of the inverter $I_1$ ($I_2$) is supplied to the gates of the N-channel transistors $N_{2a}$ and $N_{1a}$ ($N_{2b}$ and $N_{1b}$). The output MD of the differential amplifier 6 is supplied to a latch circuit 11A and one of the input terminals of an EXOR circuit 12. A data in the latch circuit 11A is inputted to another input terminal of the EXOR circuit 12, whose output is supplied to a latch circuit 11B. The EXOR circuit 12 compares the data obtained in the previous pseudo read with the data obtained in the ordinary read, thereby discriminating the volatilization of the read memory cell. A data in the latch circuit 11B is outputted to a volatilization detecting terminal 13.

Still another power voltage terminal $V_{CC}$ is connected, via a series circuit formed with P-channel transistors $P_{2a}$ and $P_{2b}$ to a node between the P-channel transistor $P_{1b}$ and the N-channel transistor $N_{1b}$ and the gates of the P-channel transistors $P_{1b}$ and $P_{2b}$. A shift data in the shift register 10 is inputted to the latch circuit 11A and the gate of the P-channel transistor $P_{2a}$.

Thus, the differential amplifier 6, the P-channel transistors $P_{1a}$ and $P_{1b}$ and the N-channel transistors $N_{1a}$ and $N_{1b}$ together form a sense amplifier. Further, the P-channel transistors $P_{2a}$ and $P_{2b}$ surrounded by a broken line in FIG. 2 form a sense characteristic modifying circuit 9 for modifying the sense characteristic of the sense amplifier.

Figure 3:
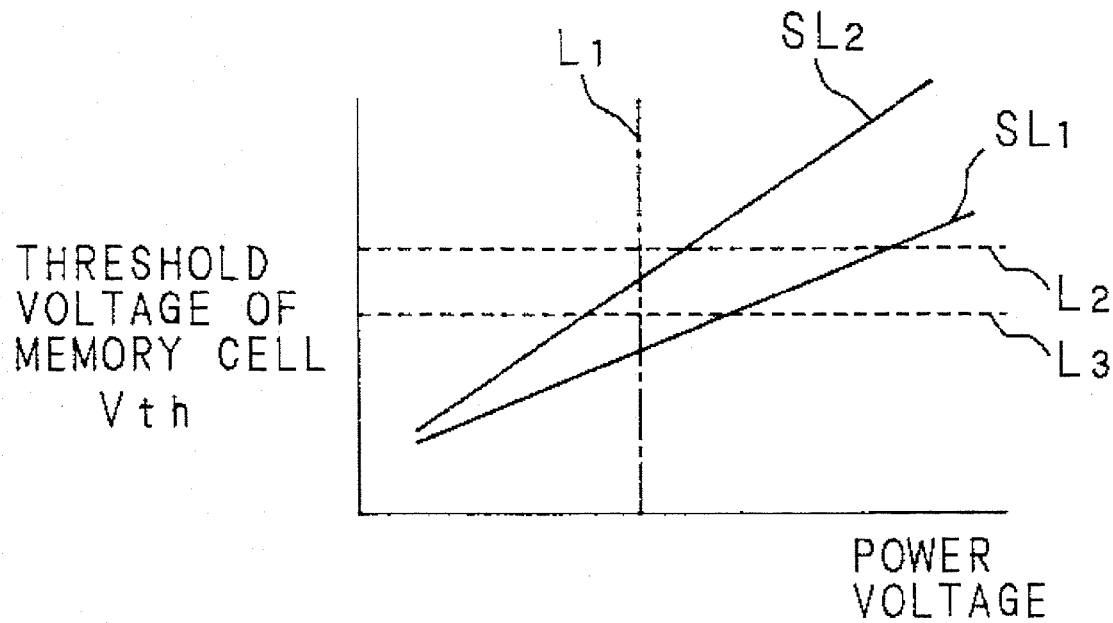
FIG. 3 is a graph showing the sense characteristic of a sense amplifier in the nonvolatile semiconductor storage device of the invention.

FIG. 3 is a graph showing the modification of the sense characteristic of the sense amplifier, in which the abscissa indicates a power voltage and the ordinate indicates a threshold voltage $V_{th}$ of a memory cell after data writing. In this graph, $L_1$ denotes a power voltage at the time of data read, $L_2$ denotes a threshold voltage of a memory cell after data write, $L_3$ denotes a threshold voltage of a memory cell after volatilization, $SL_1$ denotes a sense characteristic in the ordinary read, and $SL_2$ denotes a sense characteristic in the pseudo read (hereinafter referred to as the pre-read) performed before the ordinary read.

The threshold voltage $V_{th}$ after data writing in the memory cell 7 generally increases up to 4 through 5 V, and the sense characteristic $SL_1$ is designed so as to allow the sense amplifier to perform the sense operation with a sufficient margin of 8 through 9 V under application of a high power voltage.

Figure 4:
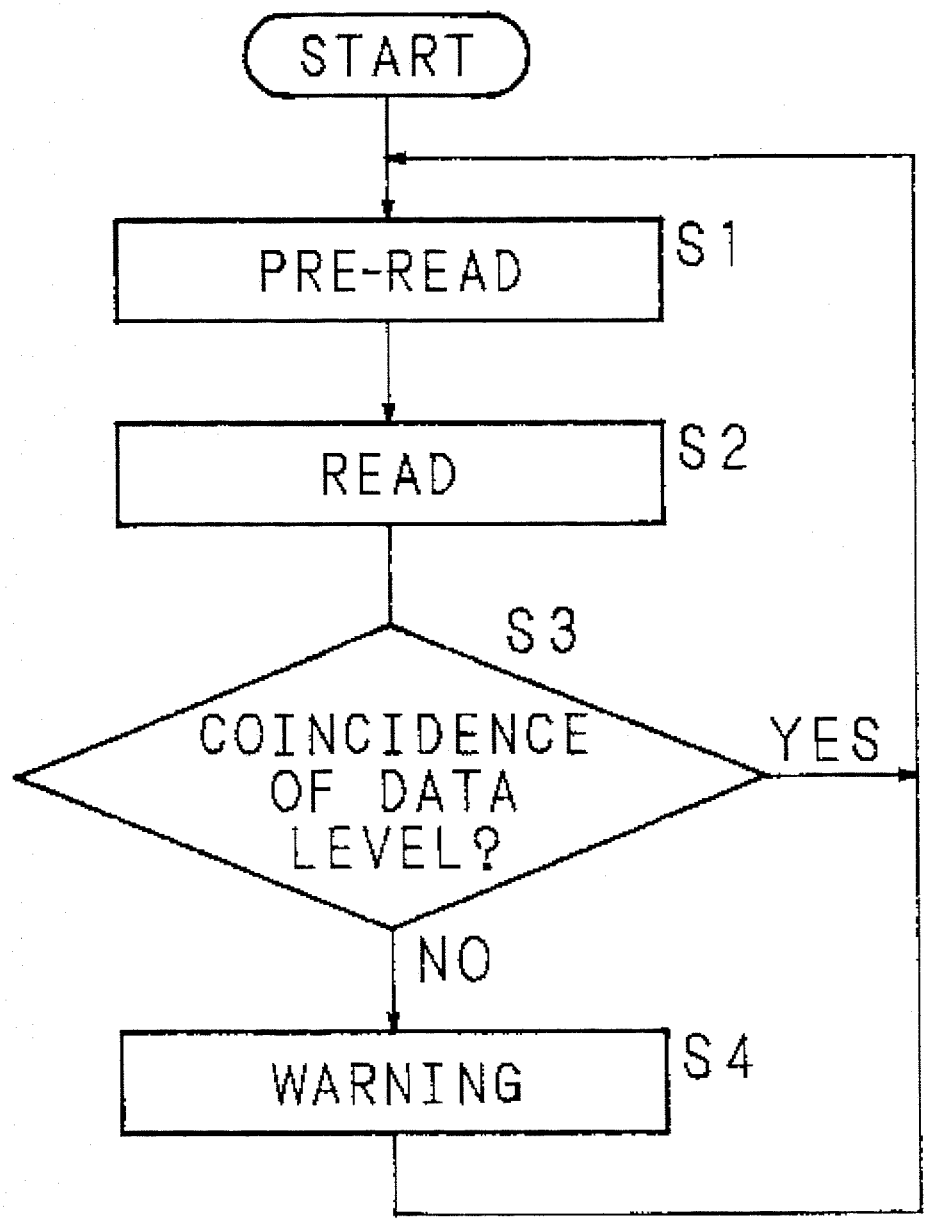
FIG. 4 is a flow chart showing the operation procedure for the nonvolatile semiconductor storage device of the invention.

The operation procedure for the data read in such a nonvolatile semiconductor storage device will now be described referring to a flow chart shown in FIG. 4.

When the read signal 14 is supplied, the pre-read is performed (S1) before the ordinary read of the data in the memory cell 7. When performing the pre-read, the sense characteristic modifying circuit 9 is controlled to select the sense characteristic $SL_2$ by using the output of the shift register 10 varying in accordance with the read signal 14. Thus, the verification criterion of the sense characteristic is made more strict. When the memory cell 7 has started to volatilize, the threshold voltage $V_{th}$ of the memory cell 7 is detected to have been decreased to the threshold voltage $L_3$. The data read at this point is latched in the latch circuit 11A.

Then, the sense characteristic $SL_2$ is changed to the sense characteristic $SL_1$, and the data in the memory cell 7 is subjected to the ordinary read, so-called the "read" (S2) on the basis of the sense characteristic with the less strict criterion. The level of the data read through this ordinary read is compared with that of the data read in the pre-read so as to judge whether or not the levels coincide with each other (S3). If the memory cell 7 has started to volatilize, the levels are different from each other. In this case, a so-called a warning is performed so as to discriminate the volatilization of the memory cell 7 (S4). Then, the EXOR circuit 12 outputs a data resulting from the discrimination, and the data is latched in the latch circuit 11B and is outputted to the volatilization detecting terminal 13. In this manner, it can be informed the external that the memory cell 7 has started to volatilize before driving a circuit for reading the data. Thus, the abnormality of the memory cell can be informed an external device and the like before misreading the data in the memory cell the volatilization.

(Second embodiment of nonvolatile semiconductor storage device)

Figure 5:
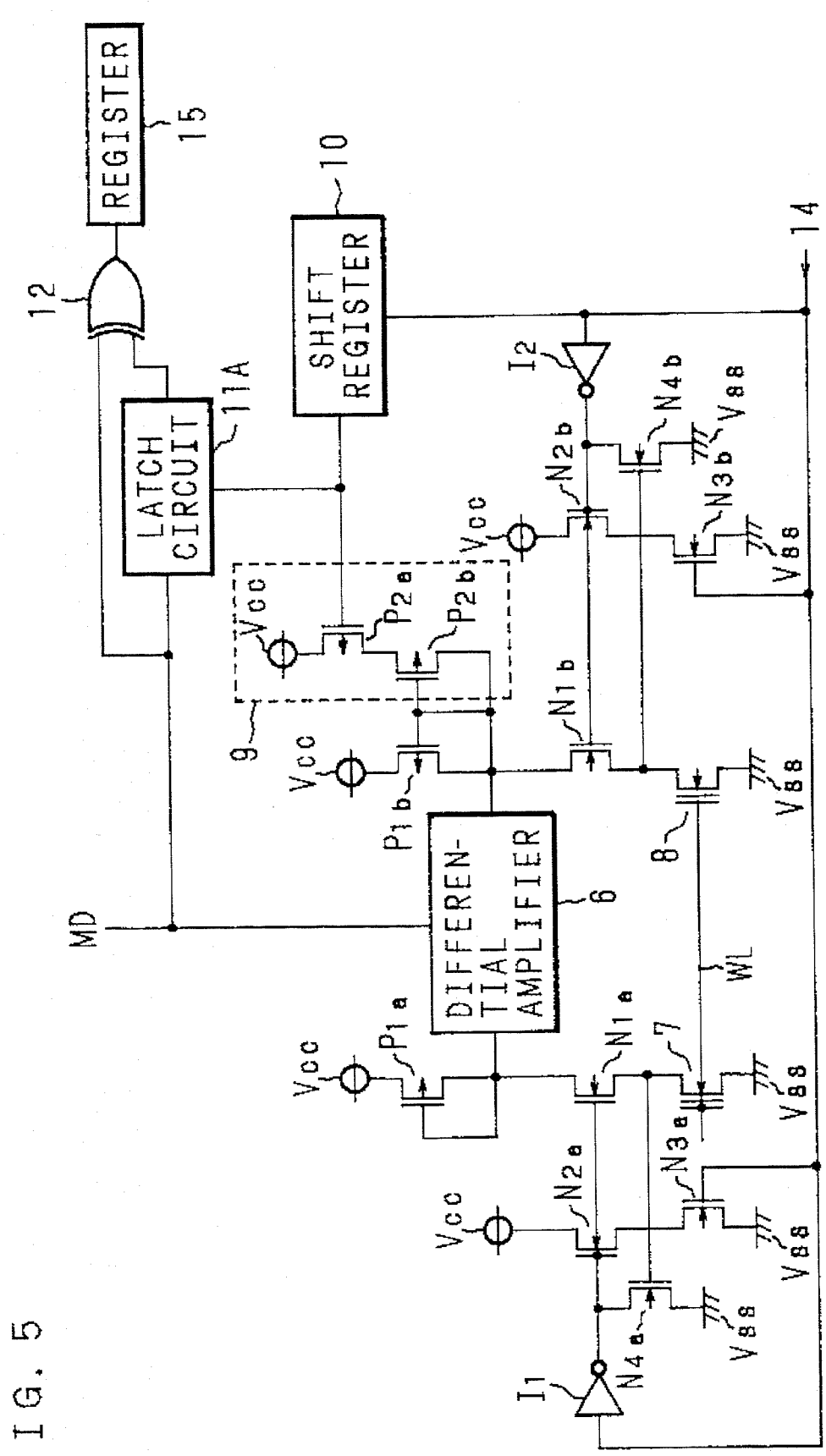
FIG. 5 is a diagram showing the configuration of the main portion of a second embodiment of the nonvolatile semiconductor storage device according to the invention.

FIG. 5 is a block diagram showing the configuration of the main portion of a second embodiment of the nonvolatile semiconductor storage device according to the invention. In this storage device, the output of an EXOR circuit 12 is supplied to a register 15. The rest of the configuration is the same as that shown in FIG. 2, and therefore, the same reference numerals are used to refer to the same elements. This nonvolatile semiconductor storage device performs a warning operation similarly to the first embodiment shown in FIG. 2. The result of the warning operation is stored in the register 15. Therefore, a CPU or any other appropriate device can check the warning operation.

(Third embodiment of nonvolatile semiconductor storage device)

Figure 6:
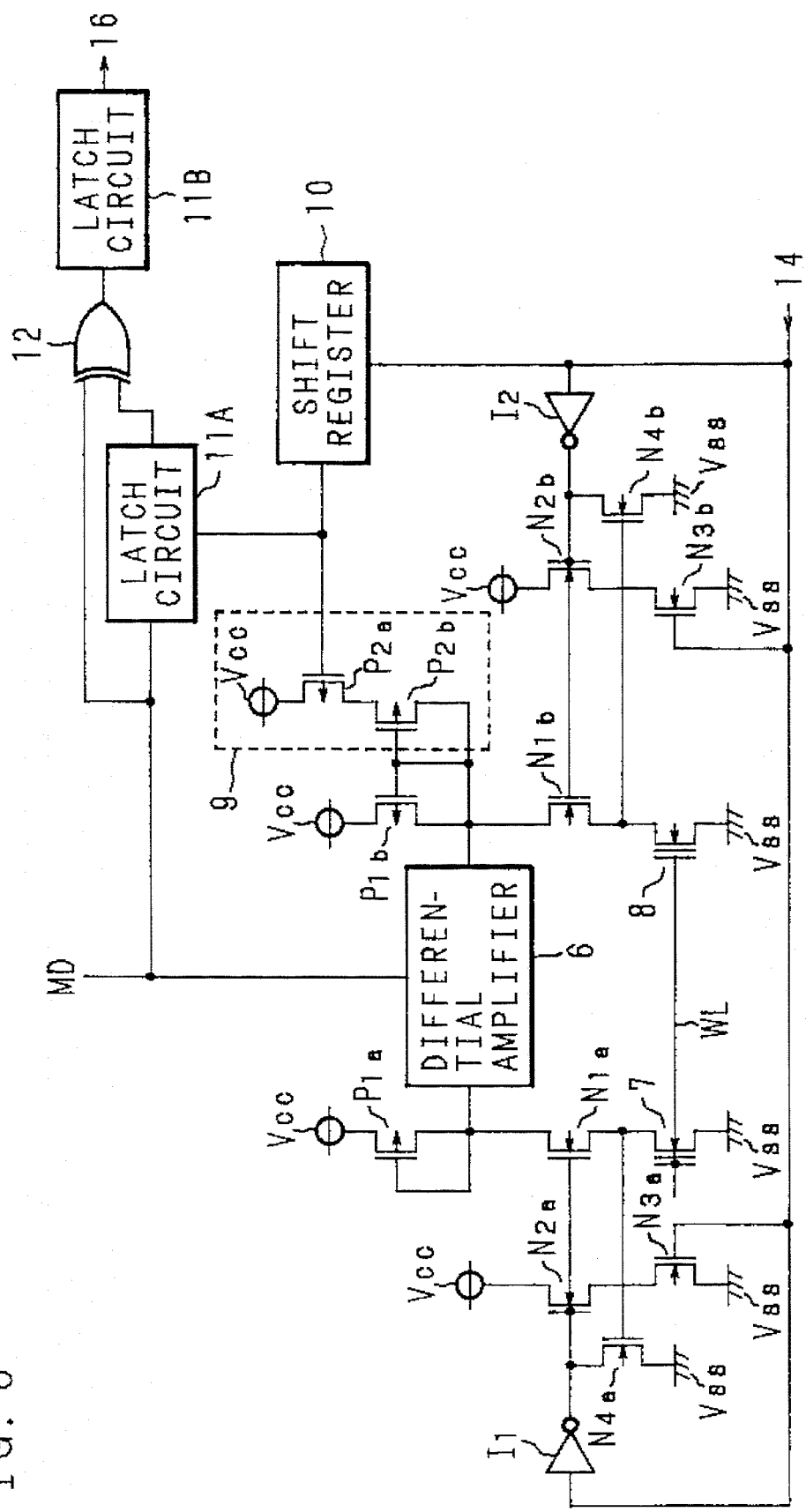
FIG. 6 is a diagram showing the configuration of the main portion of a third embodiment of the nonvolatile semiconductor storage device according to the invention.

FIG. 6 is a block diagram showing the configuration of the main portion of a third embodiment of the nonvolatile semiconductor storage device according to the invention. In this storage device, the output of an EXOR circuit 12 is supplied to a latch circuit 11B, which outputs a reset signal 16. The rest of the configuration is the same as that shown in FIG. 2, and therefore, the same reference numerals are used to refer to the same elements. Also this nonvolatile semiconductor storage device performs a warning operation similarly to the first embodiment shown in FIG. 2. The reset signal 16 is outputted as the result of the warning operation, thereby determining that it is inadequate to use the memory cell. Thus, the malfunction and runaway of a device and the like can be prevented from occurring.

(Fourth embodiment of nonvolatile semiconductor storage device)

Figure 7:
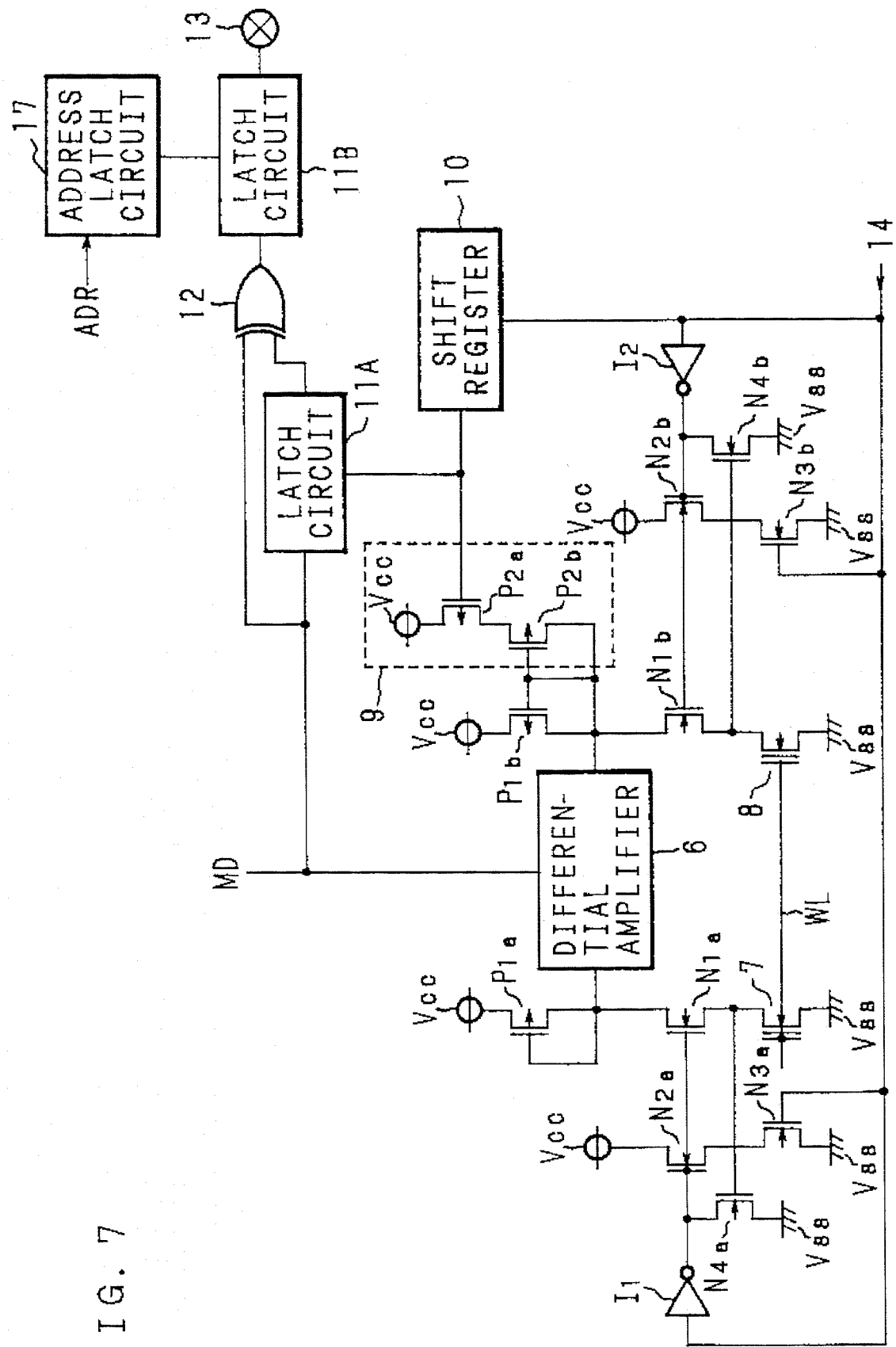
FIG. 7 is a diagram showing the configuration of the main portion of a fourth embodiment of the nonvolatile semiconductor storage device according to the invention.

FIG. 7 is a block diagram showing the configuration of the main portion of a fourth embodiment of the nonvolatile semiconductor storage device according to the invention. The output of a latch circuit 11B is supplied to a volatilization detecting terminal 13 and an address latch circuit 17. The address latch circuit 17 receives an address signal ADR. The rest of the configuration is the same as that shown in FIG. 2, and therefore, the same reference numerals are used to refer to the same elements. Also this nonvolatile semiconductor storage device performs a warning operation similarly to the first embodiment shown in FIG. 2. When a signal indicating the volatilization of a memory cell is outputted from the EXOR circuit 12 to be latched by the latch circuit 11B, the address of the memory cell is latched in the address latch circuit 17. Thus, the address of the memory cell suffering volatilization can be informed.

(Fifth embodiment of nonvolatile semiconductor storage device)

Figure 8:
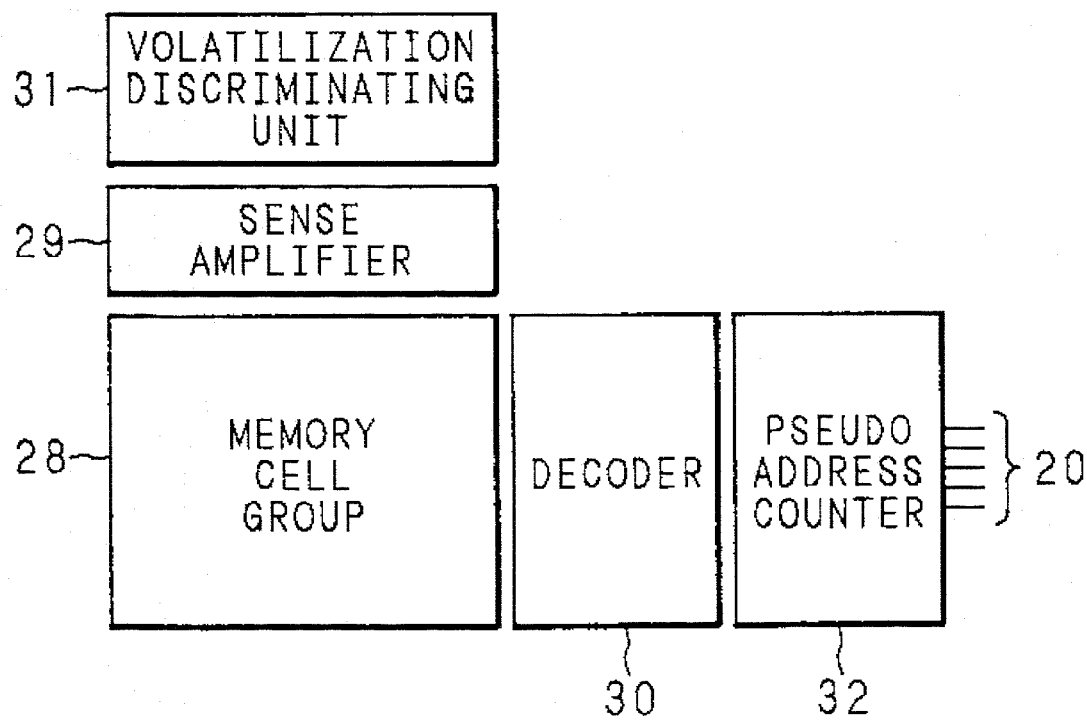
FIG. 8 is a diagram showing the configuration of the main portion of a fifth embodiment of the nonvolatile semiconductor storage device according to the invention.

FIG. 8 is a block diagram showing the configuration of the main portion of a fifth embodiment of the nonvolatile semiconductor storage device according to the invention. This embodiment includes a memory cell group 28, a sense amplifier 29, a decoder 30, a volatilization discriminating unit 31 and a pseudo address counter 32. The memory cell group 28, the sense amplifier 29 and the decoder 30 form a nonvolatile semiconductor storage device similar to the aforementioned embodiments. The volatilization discriminating unit 31 is formed with the EXOR circuit 12 similarly to the aforementioned embodiments.

The operation of this nonvolatile semiconductor storage device will be described referring to a timing chart for each signal shown in FIG. 9. The operation for discriminating the volatilization of a memory cell is performed similarly to the first embodiment shown in FIG. 2. In FIG. 9 (a) shows an enable signal, and the memory cell group 28 is accessed when the enable signal is at a low level; FIG. 9 (b) shows an area signal for selecting an area in the memory cell group 28, and a predetermined area is selected when the area signal is at a high level; FIG. 9 (c) shows an address signal; and FIG.

9 (d) shows a pre-read control signal, and the pre-read is performed when the pre-read control signal is at a high level. The sense characteristic used during the pre-read control signal being at a high level has a more strict verification criterion as described above.

In the address signal shown in FIG. 9 (c), a period 22 corresponds to an address to be accessed when the data in a memory cell is ordinarily read, and a period 23 corresponds to a local pseudo address of the memory cell group 28. In the pre-read control signal, a period 24 corresponds to an ordinary read period, a period 25 corresponds to a pseudo read period, a period 26 corresponds to a pre-read period, and a period 27 corresponds to a comparison read period.

In the nonvolatile semiconductor storage device of the fifth embodiment, in the ordinary read of the data in the memory cell group 28, a period excluding a period for accessing the memory cell group 28, i.e., a free period of the memory cell group 28, is used as follows: the pseudo address counter 32 outputs the local pseudo address 20 of the memory cell group 28 as shown in FIG. 9 (c), thereby causing the pre-read period 26 and the comparison read period 27 as shown in FIG. 9 (d). Thus, the volatilization of a memory cell is previously discriminated. According to this embodiment, the volatilization of a memory cell can be discriminated without reading one address twice by using a software and without sacrificing the operational cycle of the semiconductor storage.

(Sixth embodiment of nonvolatile semiconductor storage device)

Figure 10:
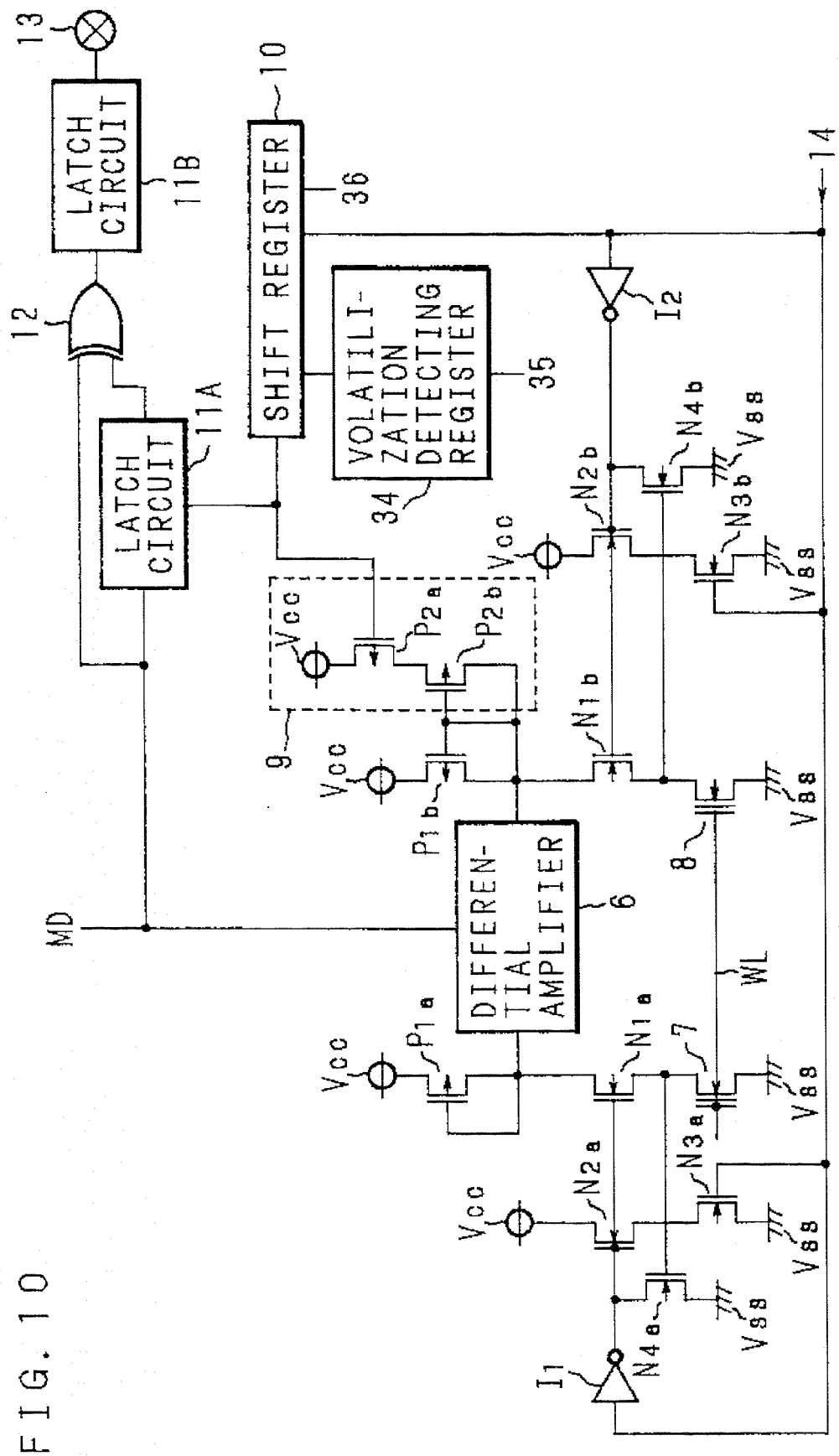
FIG. 10 is a diagram showing the configuration of the main portion of a sixth embodiment of the nonvolatile semiconductor storage device according to the invention.

FIG. 10 is a block diagram showing the configuration of the main portion of a sixth embodiment of the nonvolatile semiconductor storage device according to the invention. In this storage device, a wait mode signal 35 for activating an enable signal is supplied to a volatilization detecting register 34 in accordance with the operation of a device having a low operational speed, and the content of the volatilization detecting register 34 is inputted to a shift register 10. The shift register 10 is supplied with a clock 36 for dividing a period for reading a data into two parts; a former half and a latter half. The rest of the configuration is the same as that shown in FIG. 2, and therefore, the same reference numerals are used to refer to the same elements.

Figure 11:
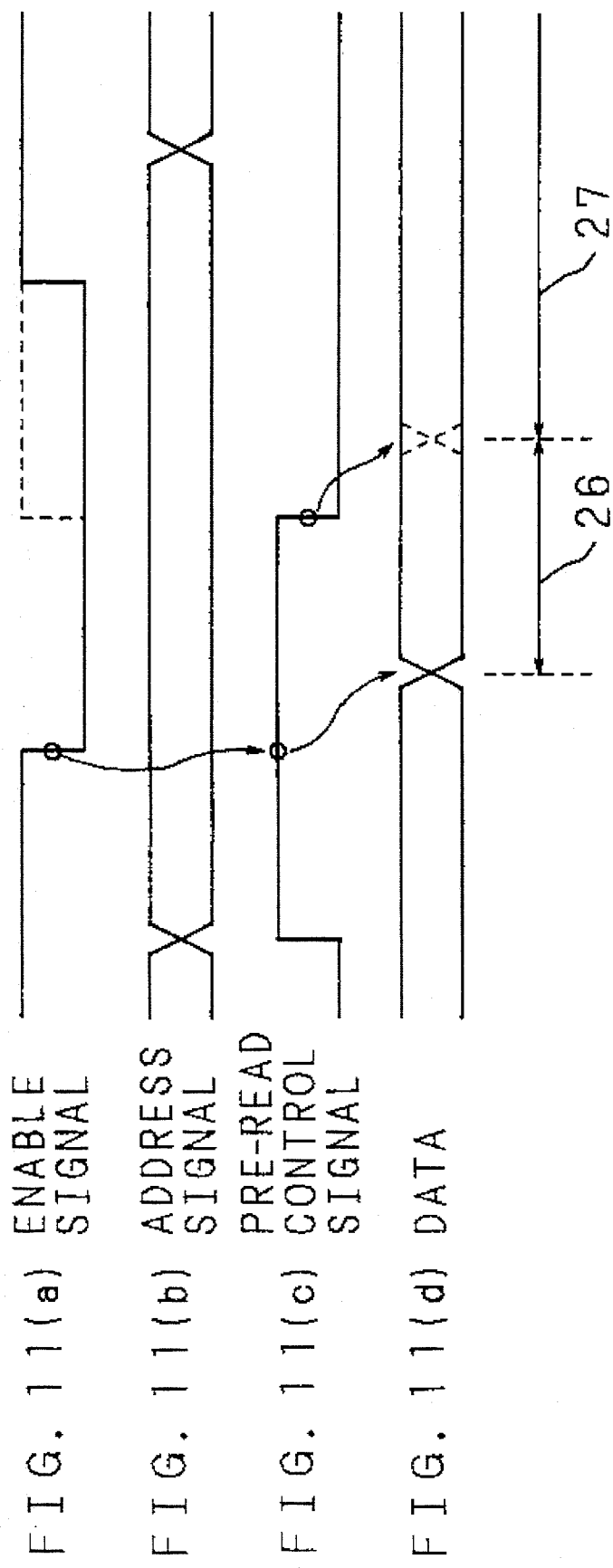
FIG. 11 is a timing chart of each signal used in the sixth embodiment.

FIG. 11 is a timing chart for each signal used in this nonvolatile semiconductor storage device. FIG. 11 (a) shows an enable signal, and a period in which the enable signal is at a low level is elongated in the wait mode, differently from the case shown in FIG. 9 (a). FIG. 11 (b) shows an address signal and FIG. 11 (c) shows a pre-read control signal. The former half of the enable signal corresponds to a pre-read period 26, and the latter half thereof corresponds to an ordinary read period 27. FIG. 11 (d) shows a data read from a memory cell. In the former half of a period for accessing a memory cell, the data in the memory cell is outputted through the pre-read, and in the latter half of the period, the data is outputted through the ordinary read. The thus read data are compared with each other.

In accessing a memory cell, the nonvolatile semiconductor storage device of this embodiment is operated in the wait mode when a volatilization discriminating mode is entered. Then, the period in which the enable signal is at a low level is elongated as shown (a) in FIG. 11 (a). In the former half of this elongated period, the memory cell is pre-read, and the data is read on the basis of a sense characteristic with a more strict criterion. In the latter half, the data is read on the basis of another sense characteristic with a less strict criterion. The thus read data are compared with each other. Therefore, there is no need to read one address successively twice so as to discriminate the volatilization of a memory cell.

(Seventh embodiment of nonvolatile semiconductor storage device)

Figure 12:
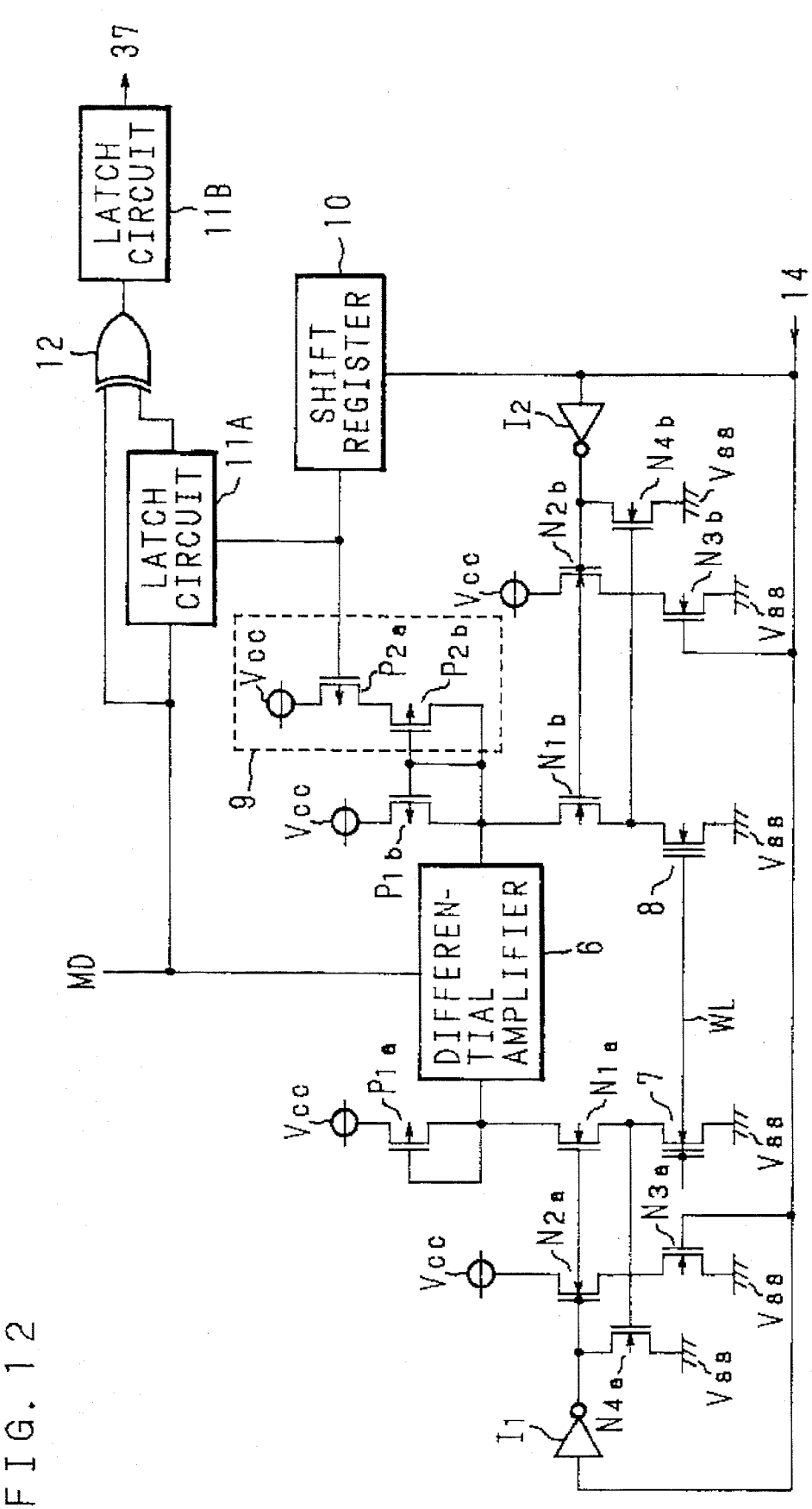
FIG. 12 is a diagram showing the configuration of the main portion of a seventh embodiment of the nonvolatile semiconductor storage device according to the invention.

FIG. 12 is a block diagram showing the configuration of the main portion of a seventh embodiment of the nonvolatile semiconductor storage device according to the invention. A latch circuit 11B outputs an MPU mode signal 37, thereby discriminating the volatilization of a memory cell and shifting the semiconductor storage device to an MPU mode. The rest of the configuration is the same as that shown in FIG. 2, and therefore, the same reference numerals are used to refer to the same elements.

Figure 13:
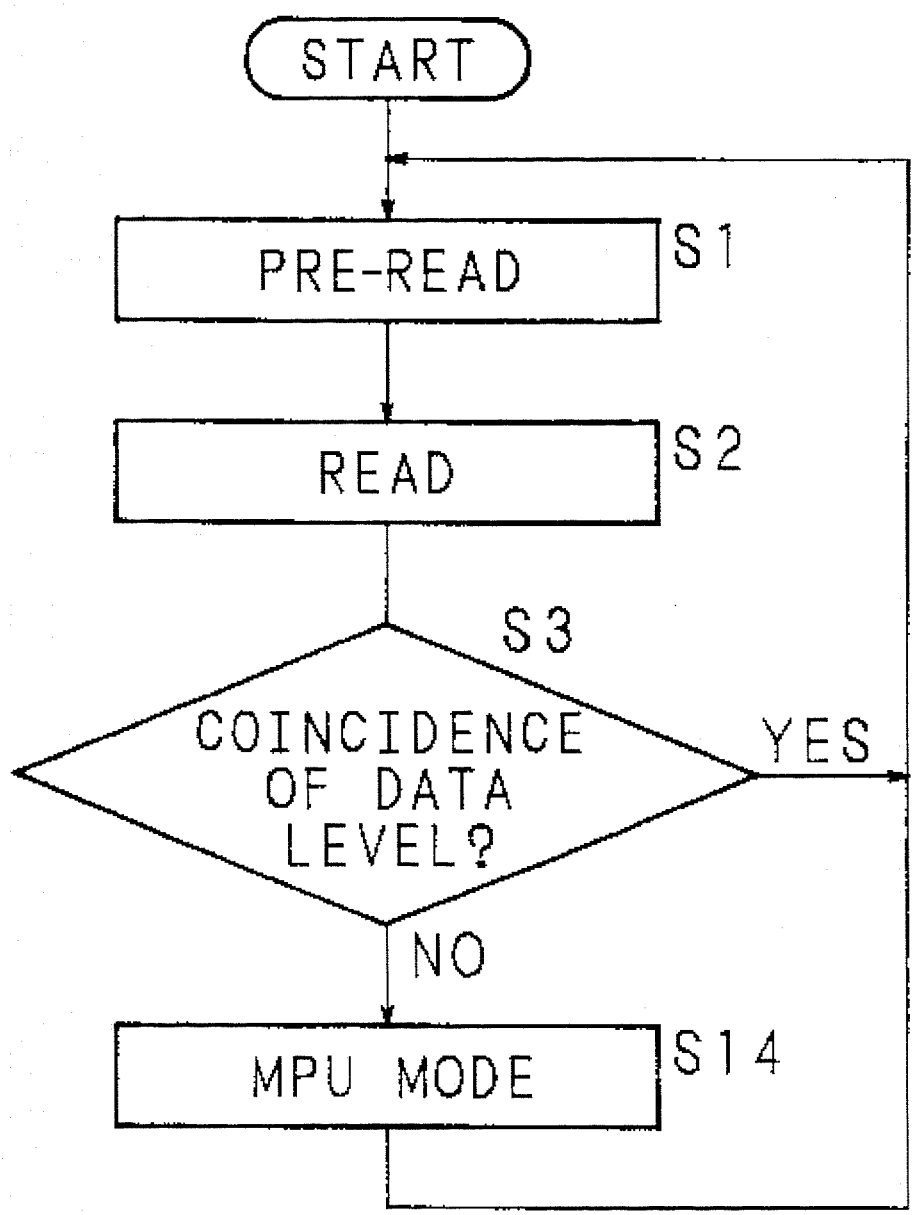
FIG. 13 is a flow chart showing the operation procedure for the nonvolatile semiconductor storage device of the invention.

The operation of this nonvolatile semiconductor storage device will now be described referring to a flow chart in FIG. 13 showing the operational procedure. The data in a memory cell is pre-read in the above-mentioned manner (S1), and the data is ordinarily read (S2). The level of the data pre-read on the basis of a sense characteristic with a more strict criterion is compared with the level of the data read on the basis of another sense characteristic with a less strict criterion (S3). When it is judged that the levels do not coincide (S3: NO), the latch circuit 11b outputs the MPU mode signal 37 (S14). In this manner, the semiconductor storage device can be placed in the MPU mode when the volatilization of a memory cell is detected.

(First embodiment of semiconductor device)

Figure 14:
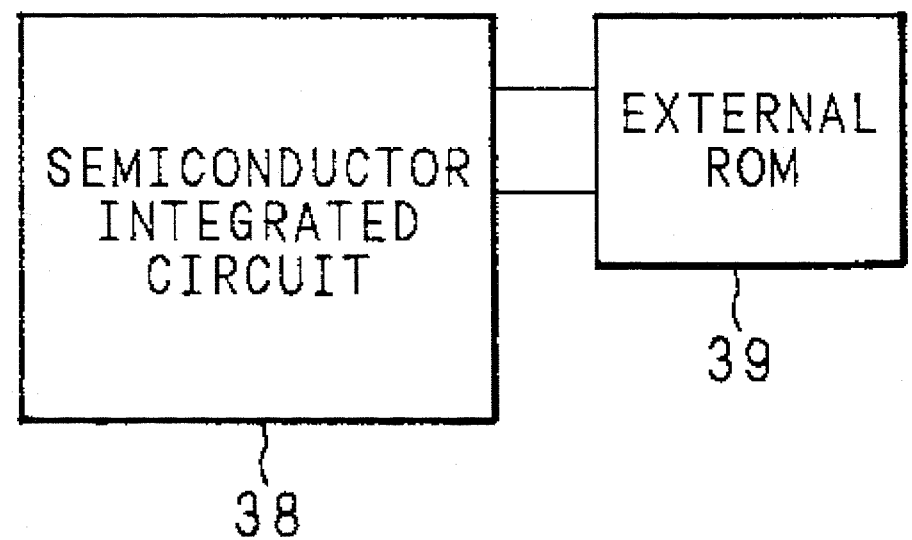
FIG. 14 is a diagram showing the configuration of the main portion of a first embodiment of a semiconductor device according to the invention.

FIG. 14 is a block diagram showing the configuration of the main portion of a first embodiment of a semiconductor device which the nonvolatile semiconductor storage device of the invention is built in. A semiconductor integrated circuit 38, which the nonvolatile semiconductor storage device of the invention is built in, is connected to an external ROM 39. When a memory cell (not shown) built in the semiconductor integrated circuit 38 is accessed and the volatilization of the accessed memory cell is detected, this semiconductor device determines that the reliability of the memory cell is low and terminates the usage of the built-in memory cell. Then, the semiconductor integrated circuit 38 is shifted to the MPU mode, thereby accessing the external ROM 39 that is externally provided for emergency. The semiconductor device is thus operated in accordance with the program in the external ROM 39. Accordingly, the malfunction and the runaway of the device and the like, which can otherwise be caused by the volatilization of the memory cell in the semiconductor integrated circuit 38, can be surely prevented beforehand.

(Second embodiment of semiconductor device)

Figure 15:
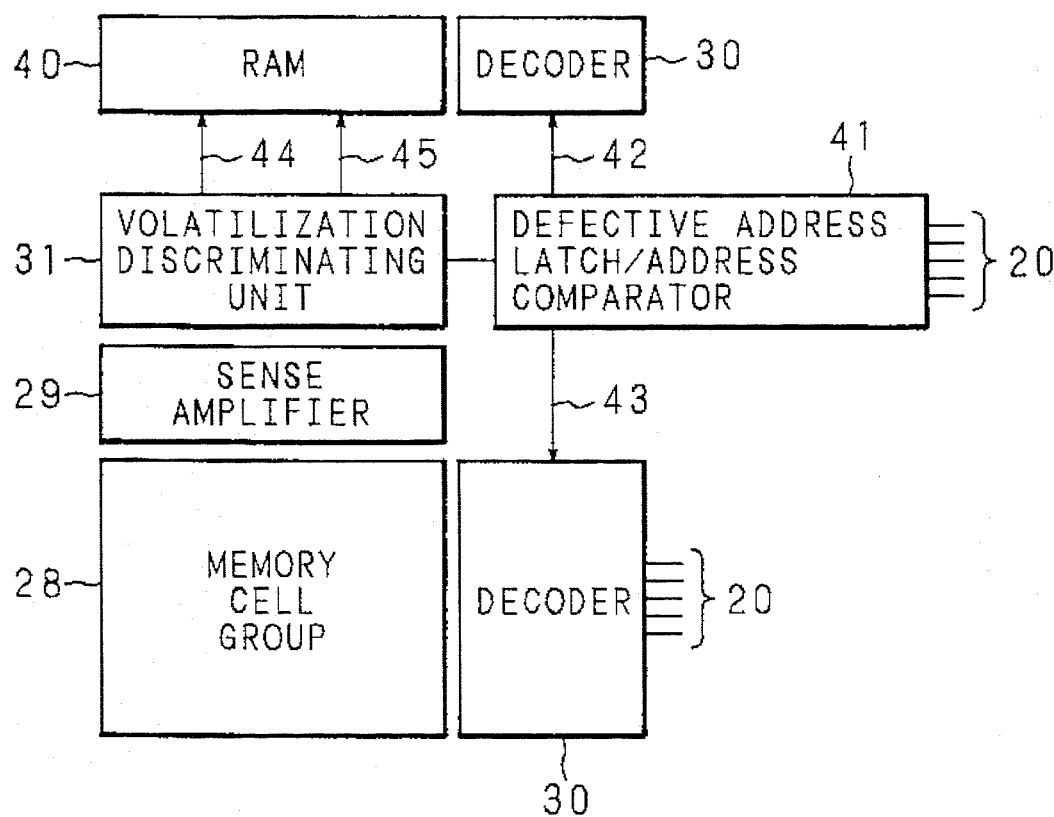
FIG. 15 is a diagram showing the configuration of the main portion of a second embodiment of the semiconductor device according to the invention.

FIG. 15 is a block diagram showing the configuration of the main portion of a second embodiment of the semiconductor device which the nonvolatile semiconductor storage device of the invention is built in. This semiconductor device has a memory cell group 28, a sense amplifier 29, a volatilization discriminating unit 31 and decoders 30. A data 44 read from the memory cell group 28 and outputted from the volatilization discriminating unit 31 and a RAM write signal 45 are inputted to a RAM 40. A RAM enable signal 42 outputted from a defective address latch/address comparator 41, which receives an address 20, is inputted to the decoder 30 for the RAM 40. A storage disable signal 43 is inputted to the other decoder 30 for the memory cell group 28. A signal indicating the volatilization, which is outputted from the volatilization discriminating unit 31, is inputted to the defective address latch/address comparator 41. The decoder 30 for the memory cell group 28 receives the address 20.

In the semiconductor device having the aforementioned configuration, when the volatilization of a memory cell in the memory cell group 28 is detected, the address of the memory cell suffering volatilization is changed to an address in the RAM 40, and a data 44 read from the memory cell group 28 on the basis of a sense characteristic with a less strict criterion is stored in the RAM 40. Specifically, when the volatilization discriminating unit 31 detects the volatilization of a memory cell, the RAM write signal 45 is activated, thereby writing the data 44 read from the memory cell group 28 into the RAM 40. The defective address latch/address comparator 41 latches the address of the memory cell suffering volatilization. Then, when the same address is accessed next, the accessed address is compared with the latched address. If the accessed address coincides with the address of the memory cell suffering volatilization, the RAM enable signal 42 is activated and a disable signal 43 is also activated. Thus, the RAM 40 is accessed instead of the memory cell group 28, and the data 44 read from the memory cell group 28 is written into the RAM 40. In this manner, the data 44 read from the memory cell suffering volatilization is written into the RAM 40. Therefore, a currently executed program can be continuously executed.

(Third embodiment of semiconductor device)

Figure 16:
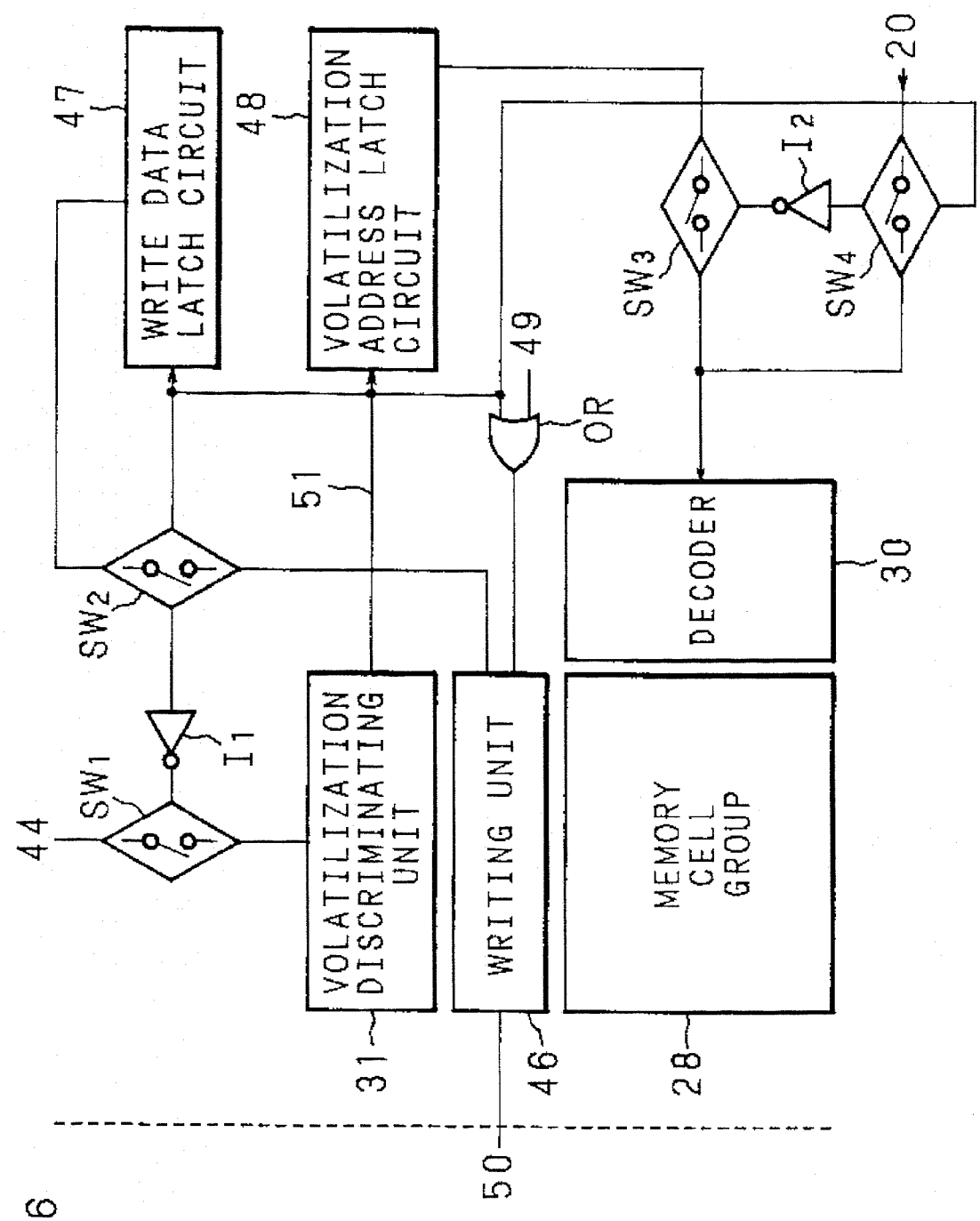
FIG. 16 is a diagram showing the configuration of the main portion of a third embodiment of the semiconductor device according to the invention.

FIG. 16 is a block diagram showing the configuration of the main portion of a third embodiment of the semiconductor device in which the nonvolatile semiconductor storage device of the invention is built. This semiconductor device has a memory cell group 28, a decoder 30, a volatilization discriminating unit 31, a writing unit 46, a write data latch circuit 47, a volatilization address latch circuit 48, switching circuits $SW_1$, $SW_2$, $SW_3$ and $SW_4$, inverters $I_1$ and $I_2$ and an OR circuit OR. The writing unit 46 is supplied with a power voltage 50 for writing. A data 44 to be written into the memory cell group 28 is inputted to the writing unit 46 via the switching circuit $SW_1$. A data in the write data latch circuit 47 is inputted to the writing unit 46 via the switching circuit $SW_2$.

A volatilization detecting signal 51 outputted from the volatilization discriminating unit 31 is supplied to the write data latch circuit 47, the volatilization address latch circuit 48, and the switching circuits $SW_2$ and $SW_4$, and also to the switching circuit $SW_1$ via the inverter $I_1$, the switching circuit $SW_3$ via the inverter $I_2$, and one input terminal of the OR circuit OR. The other input terminal of the OR circuit OR receives a write signal 49, and the output of the OR circuit OR is supplied to the writing unit 46. An address data in the volatilization address latch circuit 48 is inputted to the decoder 30 via the switching circuit $SW_3$. An address 20 is inputted to the decoder 30 via the switching circuit $SW_4$.

Next, the operation of the semiconductor device will be described. The operation for discriminating the volatilization of a memory cell is performed in the same manner as in the nonvolatile semiconductor storage device shown in FIG. 2. The write data latch circuit 47 latches a normal data in a memory cell suffering volatilization, and the address of the memory cell suffering volatilization is latched in the volatilization address latch circuit 48. When the volatilization of a memory cell is detected, the volatilization discriminating unit 31 outputs the volatilization detecting signal 51. Then, the switch circuits $SW_2$ and $SW_4$ are both turned on and, regardless of the level of the write signal 49, the data in the write data latch circuit 47 is rewritten into the memory cell suffering volatilization in the memory cell group 28 by supplying the power voltage 50 for writing. At this point, the data 44 used in the ordinary data write is cutoff because the switching circuit $SW_1$ is off, and therefore the data 44 is not written into the memory cell group 28.

For writing a data into the memory cell group 28 in this manner, a high voltage (12.5 V) is required. Many of electrical equipment using such a semiconductor device utilize such a high voltage, and therefore, this high voltage can be used for the data write. Accordingly, even when volatilization occurs in a memory cell, a data in the write data latch circuit 47 is supplied instead, thereby enabling a currently executed program to be continuously executed.

(Fourth embodiment of semiconductor device)

Figure 17:
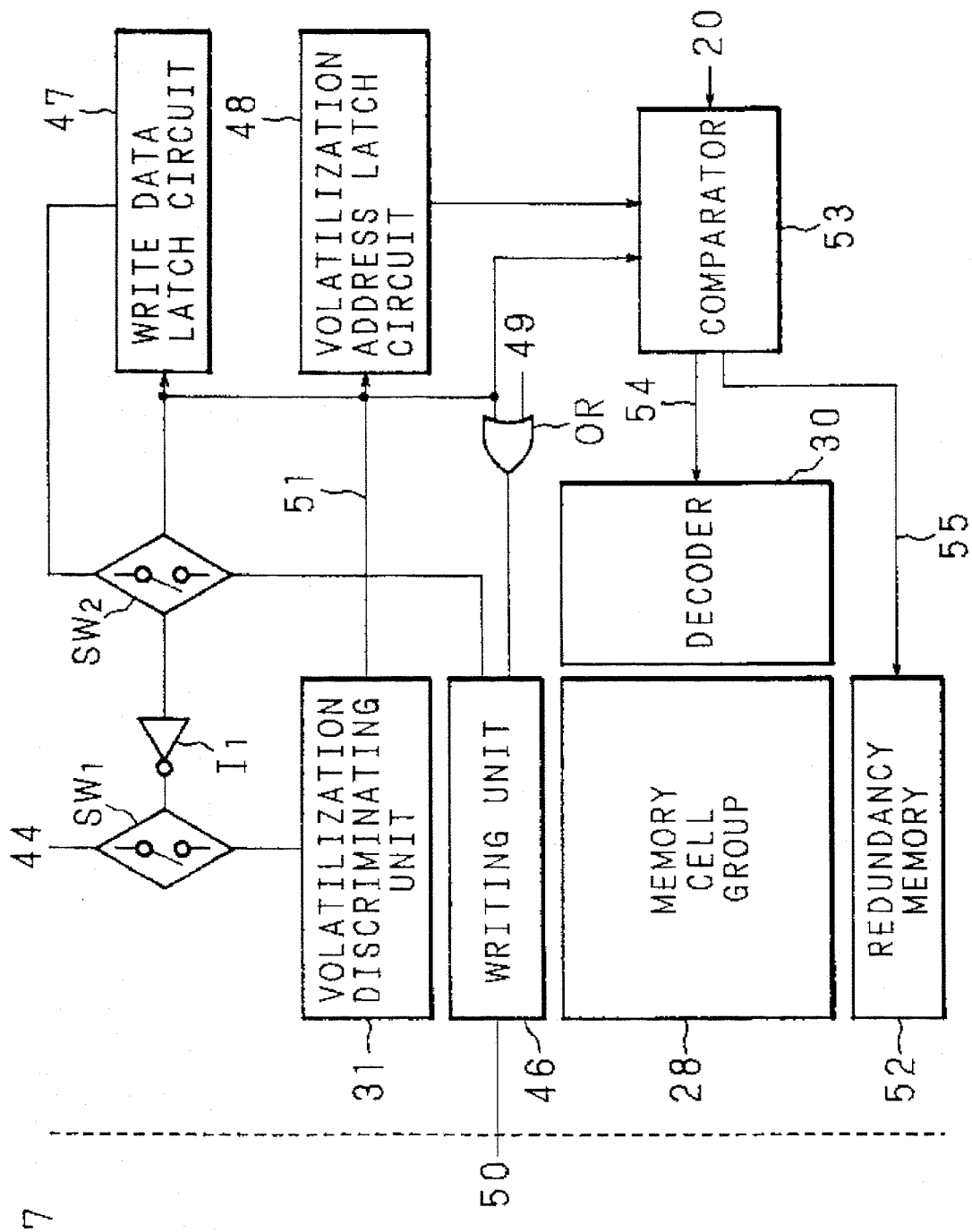
FIG. 17 is a diagram showing the configuration of the main portion of a fourth embodiment of the semiconductor device according to the invention.

FIG. 17 is a block diagram showing the configuration of the main portion of a fourth embodiment of the semiconductor device in which the nonvolatile semiconductor storage device of the invention is built. A comparator 53 receiving an address 20 is supplied with an address data from a volatilization address latch circuit 48 and a volatilization detecting signal 51 outputted from a volatilization discriminating unit 31. A disable signal 54 outputted from the comparator 53 is inputted to a decoder 30, and an enable signal 55 also outputted from the comparator 53 is inputted to a redundancy memory 52. The rest of the configuration is the same as that shown in FIG. 16, and therefore, the same reference numerals are used to refer to the same elements.

The operation of the semiconductor device having the aforementioned configuration will be described. The operation for discriminating the volatilization of a memory cell is performed as described above. While the data is rewritten into a memory cell suffering volatilization in the semiconductor device shown in FIG. 16, the data is rewritten into the redundancy memory 52 in this semiconductor device.

The normal data of the memory cell suffering volatilization is latched in the write data latch circuit 47 and the address of the memory cell suffering volatilization is latched in the volatilization address latch circuit 48 in the same manner as in the semiconductor device shown in FIG. 16.

The address in the volatilization address latch circuit 48, in which the address of a memory cell suffering volatilization is latched, is compared with an externally supplied address 20. When the addresses coincide with each other, the disable signal 54 and the enable signal 55 are both activated so as to select the redundancy memory 52 instead of the memory cell group 28. When writing the data 44, the switching circuit $SW_1$ is turned off in response to the volatilization detecting signal 51 so as not to select the memory cell group 28 but to select the redundancy memory 52. Thus, the data is written into the redundancy memory 52 having no defective memory cell caused by volatilization. Further, the address of the memory cell suffering volatilization can be stored in a nonvolatile ROM such as a flash memory. In this case, the data can be re-used even if the power is once cutoff, thereby realizing a permanent usage of the data.

(Fifth embodiment of semiconductor device)

Figure 18:
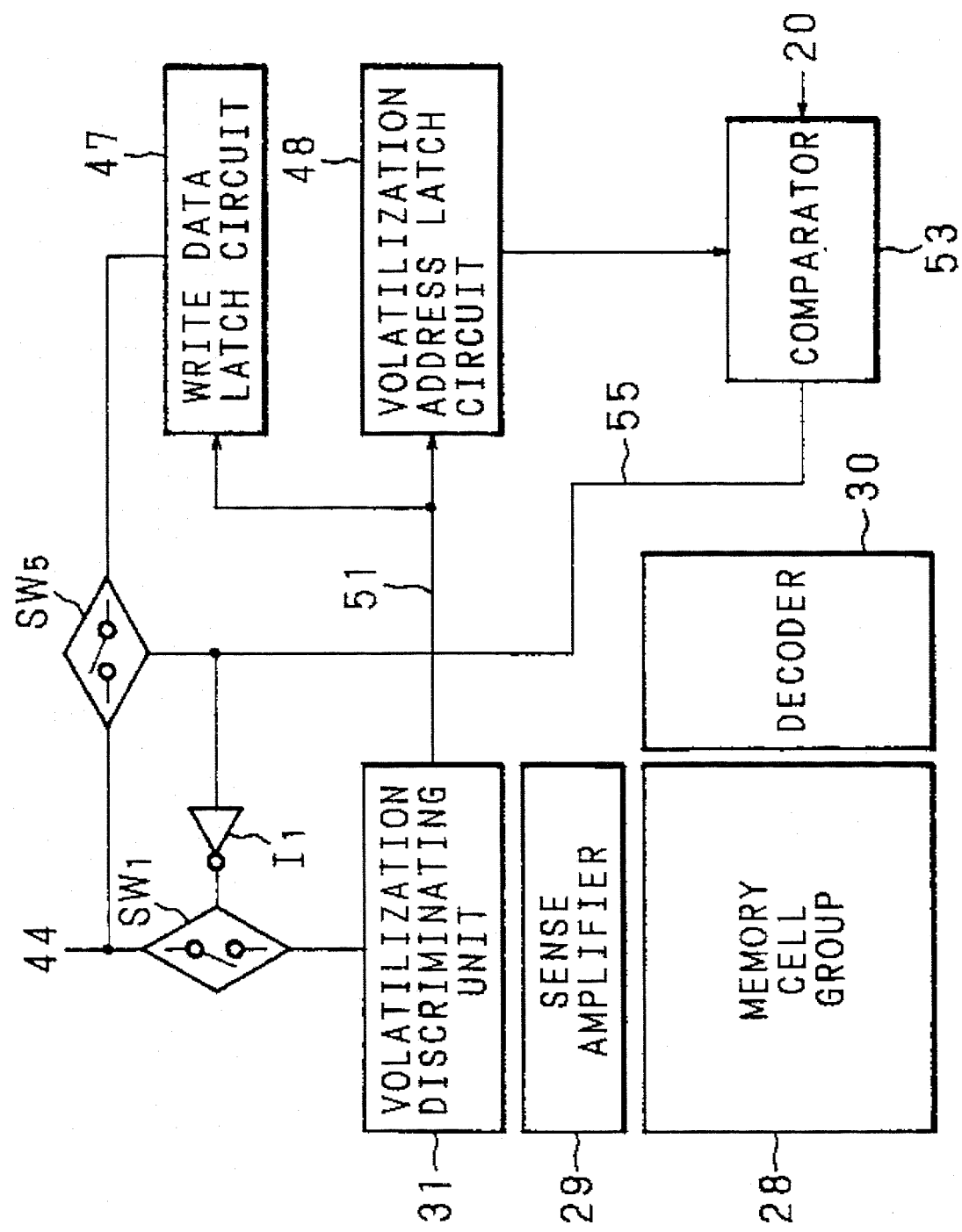
FIG. 18 is a diagram showing the configuration of the main portion of a fifth embodiment of the semiconductor device according to the invention.

FIG. 18 is a block diagram showing the configuration of the main portion of a fifth embodiment of the semiconductor device in which the nonvolatile semiconductor storage device of the invention is built. A data in a write data latch circuit 47 is supplied to one input terminal of a switching circuit $SW_1$ via a switching circuit $SW_5$. A comparator 53 receiving an address 20 and an address data latched in a volatilization address latch circuit 48 outputs an enable signal 55 when the received addresses coincide with each other. The enable signal 55 is supplied to the switching circuit $SW_5$, and also to the switching circuit $SW_1$ via an inverter $I_1$. The rest of the configuration is the same as the semiconductor device shown in FIG. 17 excluding the redundancy memory 52, and therefore, the same reference numerals are used to refer to the same elements.

Next, the operation of the semiconductor device will be described. The operation for discriminating the volatilization of a memory cell in the memory cell group 28 is performed in the aforementioned manner. The normal data of a memory cell suffering volatilization is latched in the write data latch circuit 47, and the address of the memory cell suffering volatilization is latched in the volatilization address latch circuit 48. The address data in the volatilization address latch circuit 48 is compared with the address 20 of the memory cell group 28 by the comparator 53. When the addresses coincide with each other, the enable signal 55 is activated. Then, the switching circuit $SW_1$ is turned off and the switching circuit $SW_5$ is turned on. As a result, the data in the memory cell group 28 is not outputted but the data in the write data latch circuit 47 is outputted instead.

Accordingly, a currently executed program can be continuously executed. Further, a nonvolatile ROM such as a flash memory can be used as the write data latch circuit 47 and the volatilization address latch circuit 48. In this case, the data can be re-used even when the power is once cutoff, thereby realizing a permanent usage of the data.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A nonvolatile semiconductor storage device in which a data in a memory cell is read by amplifying the data by using a sense amplifier, comprising:

characteristic modifying means for modifying a sense characteristic of said sense amplifier; and volatilization discriminating means for discriminating volatilization of the memory cell by comparing the level of a data read before modifying the sense characteristic and the level of a data read after modifying the sense characteristic.

2. A nonvolatile semiconductor storage device according to claim 1, further comprising a terminal for outputting a discrimination result obtained by said volatilization discriminating means.

3. A nonvolatile semiconductor storage device according to claim 1, wherein said characteristic modifying means includes two transistors in series.

4. A nonvolatile semiconductor storage device according to claim 1, wherein said volatilization discriminating means includes an EXOR circuit for judging whether or not the level of the data read before modifying the sense characteristic coincide with the level of the data read after modifying the sense characteristic.

5. A nonvolatile semiconductor storage device according to claim 1, further comprising a register for receiving and storing a discrimination result obtained by said volatilization discriminating means.

6. A nonvolatile semiconductor storage device according to claim 1, further comprising means for outputting a reset signal in accordance with a discrimination result obtained by said volatilization discriminating means.

7. A nonvolatile semiconductor storage device according to claim 1, further comprising an address latch circuit for latching the address of the memory cell from which the data is read.

8. A nonvolatile semiconductor storage device according to claim 1, further comprising a pseudo address counter for outputting a local pseudo address of the memory cell, wherein a data in one address is read twice during a period excluding a period for ordinarily reading the data from the memory cell.

9. A nonvolatile semiconductor storage device according to claim 1, further comprising a register for storing a data for placing said nonvoratile semiconductor storage device in a volatilization discriminating mode in which volatilization of a memory cell is discriminated, wherein an inverting period of an enable signal for enabling the data to be read from the memory cell is elongated in the volatilization discriminating mode.

10. A nonvolatile semiconductor storage device according to claim 1, further comprising means for outputting a signal for controlling a control unit in accordance with a discrimination result obtained by said volatilization discriminating means.

11. A semiconductor device, comprising:

a nonvolatile semiconductor storage device in which a data in a memory cell is read by amplifying the data using a sense amplifier, said nonvolatile semiconductor storage device including:

characteristic modifying means for modifying a sense characteristic of said sense amplifier; and volatilization discriminating means for discriminating volatilization of a memory cell by comparing the level of a data read before modifying the sense characteristic and the level of a data read after modifying the sense characteristic; and a memory unit for storing the data read before and after modifying the sense characteristic, wherein a control unit driven in accordance with the read data is driven in accordance with the data stored in said memory unit when the volatilization of the memory cell is detected.

12. A semiconductor device, comprising:

a nonvolatile semiconductor storage device in which a data in a memory cell is read by amplifying the data using a sense amplifier, said nonvolatile semiconductor storage device including:

characteristic modifying means for modifying a sense characteristic of said sense amplifier; and volatilization discriminating means for discriminating volatilization of a memory cell by comparing the level of a data read before modifying the sense characteristic and the level of a data read after modifying the sense characteristic; and a memory unit for storing a data read from a memory cell suffering volatilization, wherein the data is read from said memory unit so as to continuously execute a currently executed program when the volatilization of the memory cell is detected.

13. A semiconductor device, comprising:

a nonvolatile semiconductor storage device in which a data in a memory cell is read by amplifying the data using a sense amplifier, said nonvolatile semiconductor storage device including:

characteristic modifying means for modifying a sense characteristic of said sense amplifier; and volatilization discriminating means for discriminating volatilization of a memory cell by comparing the level of a data read before modifying the sense characteristic and the level of a data read after modifying the sense characteristic;

a data latch circuit for latching a data to be written into a memory cell;

an address latch circuit for latching the address of a memory cell suffering volatilization; and writing means for re-writing the data in said data latch circuit into the memory cell suffering volatilization when the volatilization is discriminated.

14. A semiconductor device, comprising:

a nonvolatile semiconductor storage device in which a data in a memory cell is read by amplifying the data using a sense amplifier, said nonvolatile semiconductor storage device including:

characteristic modifying means for modifying a sense characteristic of said sense amplifier; and volatilization discriminating means for discriminating volatilization of a memory cell by comparing the level of a data read before modifying the sense characteristic and the level of a data read after modifying the sense characteristic;

a data latch circuit for latching a data to be written into a memory cell;

an address latch circuit for latching the address of a memory cell suffering volatilization;

a redundancy memory for storing a data; and writing means for writing the data latched in said data latch circuit into said redundancy memory when the volatilization of the memory cell is detected.

15. A semiconductor device, comprising:

a nonvolatile semiconductor storage device in which a data in a memory cell is read by amplifying the data using a sense amplifier, said nonvolatile semiconductor storage device including:

characteristic modifying means for modifying a sense characteristic of said sense amplifier; and volatilization discriminating means for discriminating volatilization of a memory cell by comparing the level of a data read before modifying the sense characteristic and the level of a data read after modifying the sense characteristic;

a data latch circuit for latching a data to be written into a memory cell;

an address latch circuit for latching the address of a memory cell suffering volatilization;

a comparator for comparing the address latched in said address latch circuit with an externally input address; and output means for outputting the data in said data latch circuit to the external in accordance with a comparison result obtained by said comparator.

* * * * *